United States Patent
Kodama

(10) Patent No.: US 8,530,540 B2
(45) Date of Patent: Sep. 10, 2013

(54) CURABLE COMPOSITION FOR IMPRINTS, PATTERNING METHOD AND PATTERN

(75) Inventor: Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 870 days.

(21) Appl. No.: 12/498,403

(22) Filed: Jul. 7, 2009

(65) Prior Publication Data

US 2010/0009287 A1    Jan. 14, 2010

(30) Foreign Application Priority Data

Jul. 10, 2008  (JP) ................................. 2008-179986

(51) Int. Cl.
*C08F 20/22*    (2006.01)

(52) U.S. Cl.
USPC ....... 522/182; 428/64.2; 526/284; 526/323.1; 526/323.2; 526/326

(58) Field of Classification Search
USPC .......... 428/64.4, 65.1, 195.1, 64.2; 522/182; 526/284, 323.2, 325, 326
See application file for complete search history.

(56) References Cited

U.S. PATENT DOCUMENTS

| 6,017,974 | A * | 1/2000 | Hosokawa et al. | 522/99 |
| 8,025,833 | B2 * | 9/2011 | Kodama et al. | 264/496 |
| 2010/0009137 | A1 * | 1/2010 | Kodama | 428/195.1 |
| 2010/0009138 | A1 * | 1/2010 | Kodama et al. | 428/195.1 |

FOREIGN PATENT DOCUMENTS

JP    2008019292 A  *  1/2008

OTHER PUBLICATIONS

Machine translation of detailed description of JP 2008-019292 acquired on Aug. 9, 2012.*

* cited by examiner

*Primary Examiner* — Gerard Higgins
(74) *Attorney, Agent, or Firm* — Sughrue Mion, PLLC

(57) ABSTRACT

A curable composition for imprints, comprising at least one polymerizable monomer and a photopolymerization initiator, wherein the content of a polymerizable monomer having a viscosity at 25° C. of 7 mPa·s or more is 80% by mass or more, relative to all the polymerizable monomers contained in the composition. The curable composition for imprints has low volatility of the components even in a thin film coating on a substrate and is thus capable of forming a good pattern.

22 Claims, No Drawings

CURABLE COMPOSITION FOR IMPRINTS, PATTERNING METHOD AND PATTERN

BACKGROUND OF THE INVENTION

1. Field of the Invention

The present invention relates to a curable composition for imprints. More precisely, the invention relates to a curable composition for micropatterning to give imprints, which is used in producing magnetic recording media such as semiconductor integrated circuits, flat screens, microelectromechanical systems (MEMS), sensor devices, optical discs, high-density memory discs, etc.; optical members such as gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

2. Description of the Related Art

Imprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of imprint technology have been proposed; one is a thermal imprint method using a thermoplastic resin as the material to be worked (for example, see S. Chou, et al., Appl. Phys. Lett. Vol. 67, 3114 (1995)), and the other is a photoimprint method using a photocurable composition (for example, see M. Colbun, et al., Proc. SPIE, Vol. 3676, 379 (1999)). In the thermal imprint method, a mold is pressed against a polymer resin heated up to a temperature not lower than the glass transition temperature thereof, then the resin is cooled and thereafter released from the mold to thereby transfer the microstructure of the mold onto the resin on a substrate. The method is applicable to various resin materials and glass materials and is expected to be applicable to various fields. For example, U.S. Pat. Nos. 5,772,905 and 5,956,216 disclose a imprint method of forming nanopatterns inexpensively.

On the other hand, in the photoimprint method where a composition for photoimprints is photocured by photoirradiation through a transparent mold or a transparent substrate, the transferring material does not require heating in pressing it against the mold, and therefore the method enables room-temperature imprinting. Recently, new developments having the advantages of the above two as combined, have been reported, including a nanocasting method and a reversal imprint method for forming three-dimensional structures.

For the imprint methods as above, proposed are applied technologies to nano-scale mentioned below.

In the first technology, the molded pattern itself has a function, and is applied to various elements in nanotechnology and to structural members. Its examples include various micro/nano optical elements and high-density recording media, as well as structural members in optical films, flat panel displays, etc. The second technology is for hybrid-molding of microstructures and nanostructures, or for construction of laminate structures through simple interlayer positioning, and this is applied to production of μ-TAS (micro-total analysis system) and biochips. In the third technology, the formed pattern is used as a mask and is applied to a method of processing a substrate through etching or the like. In these technologies, high-precision positioning is combined with high-density integration; and in place of conventional lithography technology, these technologies are being applied to production of high-density semiconductor integrated circuits and transistors in liquid-crystal displays, and also to magnetic processing for next-generation hard discs referred to as patterned media. Recently, the action on industrialization of the above-mentioned imprint technologies and their applied technologies has become active for practical use thereof.

As one example of imprint technology, hereinunder described is an application to production of high-density semiconductor integrated circuits. The recent development in micropatterning and integration scale enlargement in semiconductor integrated circuits is remarkable, and high-definition photolithography for pattern transfer for realizing the intended micropatterning is being much promoted and advanced in the art. However, for further requirement for more definite micropatterning to a higher level, it is now difficult to satisfy all the three of micropattern resolution, cost reduction and throughput increase. Regarding this, as a technology of micropatterning capable of attaining at a low cost, imprint lithography, particularly nanoimprint lithography (photonanoimprint technology) is proposed. For example, U.S. Pat. Nos. 5,772,905 and 5,259,926 disclose a nanoimprint technology of using a silicon wafer as a stamper for transferring a microstructure of at most 25 nm. This application requires micropatternability on a level of a few tens nm and high-level etching resistance of the micropattern functioning as a mask in substrate processing.

An application example of imprint technology to production of next-generation hard disc drives (HDD) is described. Based on head performance improvement and media performance improvement closely connected with each other, the course of HDD history is for capacity increase and size reduction. From the viewpoint of media performance improvement, HDD has realized increased large-scale capacity as a result of the increase in the surface-recording density thereon. However, in increasing the recording density, there occurs a problem of so-called magnetic field expansion from the side surface of the magnetic head. The magnetic field expansion could not be reduced more than a certain level even though the size of the head is reduced, therefore causing a phenomenon of so-called sidelight. The sidelight, if any, causes erroneous writing on the adjacent tracks and may erase the already recorded data. In addition, owing to the magnetic field expansion, there may occur another problem in that superfluous signals may be read from the adjacent track in reproduction. To solve these problems, there are proposed technologies of discrete track media and bit patterned media of filling the distance between the adjacent tracks with a non-magnetic material to thereby physically and magnetically separate the tracks. As a method of forming the magnetic or non-magnetic pattern in production of these media, application of imprint technology is proposed. The application also requires micropatternability on a level of a few tens nm and high-level etching resistance of the micropattern functioning as a mask in substrate processing.

Next described is an application example of imprint technology to flat displays such as liquid-crystal displays (LCD) and plasma display panels (PDP).

With the recent tendency toward large-sized LCD substrates and PDP substrates for high-definition microprocessing thereon, photoimprint lithography has become specifically noted these days as an inexpensive lithography technology capable of being substituted for conventional photolithography for use in production of thin-film transistors (TFT) and electrode plates. Accordingly, it has become necessary to develop a photocurable resist capable of being substituted for the etching photoresist for use in conventional photolithography.

Further, for the structural members for LCD and others, application of photoimprint technology to transparent protective film materials described in JP-A-2005-197699 and 2005-301289, or to spacers described in JP-A-2005-301289 is being under investigation. Differing from the above-mentioned etching resist, the resist for such structural members finally remains in displays, and therefore, it may be referred to as "permanent resist" or "permanent film".

The spacer to define the cell gap in liquid-crystal displays is also a type of the permanent film; and in conventional photolithography, a photocurable composition comprising a resin, a photopolymerizable monomer and an initiator has been generally widely used for it (for example, see JP-A-2004-240241). In general, the spacer is formed as follows: After a color filter is formed on a color filter substrate, or after a protective film for the color filter is formed, a photocurable composition is applied thereto, and a pattern having a size of from 10 μm or 20 μm or so is formed through photolithography, and this is further thermally cured through past-baking to form the intended spacer.

Further, imprint lithography is useful also in formation of permanent films in optical members such as microelectromechanical systems (MEMS), sensor devices, gratings, relief holograms, etc.; optical films for production of nanodevices, optical devices, flat panel displays, etc.; polarizing elements, thin-film transistors in liquid-crystal displays, organic transistors, color filters, overcoat layers, pillar materials, rib materials for liquid-crystal alignment, microlens arrays, immunoassay chips, DNA separation chips, microreactors, nanobio devices, optical waveguides, optical filters, photonic liquid crystals, etc.

In application to such permanent films, the formed pattern remains in the final products, and is therefore required to have high-level properties of mainly film durability and strength, including heat resistance, light resistance, solvent resistance, scratch resistance, high-level mechanical resistance to external pressure, hardness, etc.

Almost all patterns heretofore formed in conventional photolithography can be formed in imprint technology, which is therefore specifically noted as a technology capable of forming micropatterns inexpensively.

It is an assumption that these applications form a good pattern, however, with regard to the photoimprint method in the patterning, it is necessary for a liquid curable composition to be sufficiently charged in a mold, and the composition is required to have a low viscosity. Accordingly, there are many cases where a polymerizable monomer referred to as a low-viscosity reactive diluent (low viscosity compound) is blended in the curable composition. For example, in JP-A-2007-186570 and JP-A-2007-84625, compounds such as benzyl acrylate, N-vinylpyrrolidone, and the like are blended.

However, the present inventors have made studies so as to provide a curable composition for imprints with a lower viscosity, and as a result, they have found that the low-viscosity compound in the composition volatilizes during the patterning. If a low-viscosity compound is used, an area (specific area) per certain volume increases when the curable composition is applied into a thin film and correspondingly, the vapor-liquid interface becomes wider. Since low-viscosity compounds have high vapor pressure and high volatility even at low temperatures, the specific area in film formation increases and the high vapor pressure at a low temperature which is unique to low-viscosity compounds is multiplied even in cases where the film is formed at a temperature lower than the boiling point of the compound. This causes the compound to volatilize in large amounts. As a result, the viscosity of the curable composition of a substrate gradually increases during the film formation. Furthermore, the amount of the low-viscosity compound that volatilizes during the film formation is apparent since the specific area increases as the film thickness is reduced. In addition, in cases where the compound is diluted in a solvent and then applied, the vapor pressure is also elevated by the heating to dry the solvent and, therefore, not much of the low-viscosity compound remains on the substrate. Accordingly, the mold is pressed against the high-viscosity component remaining on the substrate, and thus, the curable composition is not sufficiently charged in the mold, and as a result, the present inventors have found that there is a problem that the patternability is deteriorated, or that when the mold is pressed, a high pressure is required.

Further, there is an existing method of curable composition, which comprises patterning at a reduced pressure or patterning conducted by introducing nitrogen after reducing the pressure in order to prevent the curing from being interfered by oxygen. If a curable composition containing a low-viscosity compound in a preparation method comprising such as pressure-reducing steps is used in patterning, the vapor pressure as a function of temperature increases relative to the total pressure after the pressure reduction, and as a result, a low-viscosity monomer which is sensitive in the response of vapor pressure to a temperature, volatilizes more easily than high-viscosity monomers. Therefore, the present inventors have found that the same problems as above occur even when not much of the low-viscosity compound remains on the substrate, and pressure-reducing steps are performed in patterning.

SUMMARY OF THE INVENTION

With consideration of solving the problems, it is an object of the invention to provide a curable composition for imprints, which has low volatility of the components on the substrate even in thin film patterning and which is capable of forming a good pattern, a patterning method using the same compound, and a pattern obtained by the patterning method.

The invention includes the following:

[1] A curable composition for imprints, comprising at least one polymerizable monomer (A) and a photopolymerization initiator (B), wherein the content of a polymerizable monomer having a viscosity at 25° C. of 7 mPa·s or more is 80% by mass or more, relative to all the polymerizable monomers contained in the composition.

[2] The curable composition for imprints as described in [1], wherein the content of a polymerizable monomer having a viscosity at 25° C. of 7 to 200 mPa·s or more is 80% by mass or more, relative to all the polymerizable monomers contained in the composition.

[3] The curable composition for imprints as described in [1], wherein the content of a polymerizable monomer having a viscosity at 25° C. of 7 to 150 mPa·s or more is 80% by mass or more, relative to all the polymerizable monomers contained in the composition.

[4] The curable composition for imprints as described in [1], wherein the content of a polymerizable monomer having a viscosity at 25° C. of 7 to 100 mPa·s or more is 80% by mass or more, relative to all the polymerizable monomers contained in the composition.

[5] The curable composition for imprints as described in [1], wherein the content of a polymerizable monomer having a viscosity at 25° C. of 8 to 50 mPa·s or more is 80% by mass or more, relative to all the polymerizable monomers contained in the composition.

[6] The curable composition for imprints as described in any one of [1] to [5], which comprises a monofunctional (meth)acrylate compound having one (meth)acrylate group and a polyfunctional (meth)acrylate compounds having two or more (meth)acrylate groups.

[7] The curable composition for imprints as described in [6], wherein the monofunctional (meth) acrylate compound having one (meth)acrylate group is a monofunctional (meth) acrylate compound having an aromatic structure, an alicyclic hydrocarbon structure or both.

[8] The curable composition for imprints as described in any one of [1] to [7], which comprises at least one of monofunctional (meth)acrylate compound having an aromatic structure and one (meth)acrylate group or a polyfunctional (meth)acrylate compound having an aromatic structure and two or more (meth)acrylate.

[9] The curable composition for imprints as described in any one of [1] to [7], wherein a mixture of all the polymerizable monomers contained in the composition has a viscosity at 25° C. from 5 to 50 mPa·s.

[10] The curable composition for imprints as described in any one of [1] to [7], wherein a mixture of all the polymerizable monomers contained in the composition has a viscosity at 25° C. from 6 to 40 mPa·s.

[11] The curable composition for imprints as described in any one of [1] to [7], wherein a mixture of all the polymerizable monomers contained in the composition has a viscosity at 25° C. from 7 to 30 mPa·s.

[12] The curable composition for imprints as described in any one of [1] to [7], wherein a mixture of all the polymerizable monomers contained in the composition has a viscosity at 25° C. from 8 to 25 mPa·s.

[13] The curable composition for imprints as described in any one of [1] to [12], which further comprises a solvent.

[14] The curable composition for imprints as described in [13], wherein the solvent comprises at least one solvent having one or more of an ester structure, a ketone structure, a hydroxyl group, and an ether structure.

[15] The curable composition for imprints as described in any one of [1] to [14], which further comprises at least one of a nonionic surfactant and an antioxidant.

[16] A patterning method comprising:
providing the curable composition for imprints as described in any one of [1] to [15] onto a substrate to form a patterning layer thereon,
pressing a mold against the surface of the patterning layer, and
irradiating the patterning layer with light,
wherein the content of a polymerizable monomer having a viscosity at 25° C. of 7 mPa·s or more is 80% by mass or more, relative to all the polymerizable monomers contained in the composition.

[17] The patterning method as described in [16], wherein a method for providing the curable composition for imprints on a substrate is a spin coating method or an inkjet method.

[18] The patterning method as described in [16] or [17], wherein in the step of providing the curable composition for imprints on a substrate to form a patterning layer thereon, the thickness in coating of the curable composition for imprints provided on the substrate is 1 μm or less.

[19] The patterning method as described in any one of [15] to [18] wherein during the processes from the step of providing the curable composition for imprints on a substrate to form a patterning layer thereon to the step of irradiating the patterning layer with light, at least one of a heating step and a pressure-reducing step is included.

[20] A pattern obtained by the patterning method as described in any one of [16] to [19].

[21] The pattern as described in [20], wherein the height from the substrate surface to the highest portion of the pattern part is 1 μm or less.

The curable composition for imprints of the invention has low volatility of the components even in a thin film coating on a substrate and is thus capable of forming a good pattern. Furthermore, even in case where a patterning method comprising a pressure-reducing step and/or a heating step is used at a time other than the time of the thin film coating, a curable composition for imprints can be provided, which has low volatility of the components on the substrate and is thus capable of forming a good pattern if the curable compositions for imprints of the invention is used.

BEST MODE FOR CARRYING OUT THE INVENTION

The contents of the invention are described in detail hereinunder. In this specification, the numerical range expressed by the wording "a number to another number" means the range that falls between the former number indicating the lowermost limit of the range and the latter number indicating the uppermost limit thereof. In this specification, mass ratio is equal to weight ratio.

In this specification, "(meth)acrylate" means acrylate and methacrylate; "(meth)acrylic" means acrylic and methacrylic; "(meth) acryloyl" means acryloyl and methacryloyl. In the invention, monomer is differentiated from oligomer and polymer, and the monomer indicates a compound having a weight-average molecular weight of at most 1,000. In this specification, "functional group" means a group participating in polymerization. "Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this specification, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Imprints]

The curable composition for imprints of the invention (which may be hereinafter simply referred to as the "composition of the invention") comprises a polymerizable monomer (A) and a photopolymerization initiator (B). The curable composition for imprints of the invention further comprises, as the a polymerizable monomer having a polymerizable functional group (hereinafter, the polymerizable monomer that the composition of the invention comprises may be referred to as the generic term "photopolymerizable monomer (A)"), 80% by mass or more of a compound having a viscosity at 25° C. of 7 mPa·s or more, relative to all the polymerizable monomers.

In addition, the curable composition typically used in the photoimprint method comprises a polymerizable monomer having a polymerizable functional group and a photopolymerization initiator that initiates the polymerization reaction of the polymerizable monomer through photoirradiation. Also, it optionally comprises a solvent, a surfactant, an antioxidant, or the like in a preferable embodiment, which also applies to the composition of the invention.

Hereinbelow, preferable embodiments of the composition of the invention will be described in order.

Polymerizable Monomer (A)

The polymerizable monomers which can be preferably used in the invention include, for example, a polymerizable unsaturated monomer having from 1 to 6 ethylenic unsaturated bond-having groups, a compound having an oxirane ring (epoxy compound), a vinyl ether compound, a styrene derivative, a fluorine atom-having compound, propenyl ether, butenyl ether, etc. From the viewpoint of the curability of the composition, more preferred is a polymerizable unsaturated monomer having from 1 to 6 ethylenic unsaturated bond-having groups.

The polymerizable unsaturated monomer having from 1 to 6 ethylenic unsaturated bond-having groups (mono- to hexafunctional polymerizable unsaturated monomer) is described below.

The polymerizable unsaturated monomer having one ethylenic unsaturated bond-having group (mono-functional polymerizable unsaturated monomer) includes concretely 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl (meth)acrylate, 2-ethylhexylcarbitol (meth)acrylate, 2-hydroxybutyl (meth)acrylate, 2-hydroxyethyl (meth)acrylate, 2-hydroxypropyl (meth)acrylate, 2-methoxyethyl (meth)acrylate, 3-methoxybutyl (meth)acrylate, 4-hydroxybutyl (meth)acrylate, acrylic acid dimer, benzyl (meth)acrylate, 1- or 2-naphthyl (meta)acrylate, butanediol mono(meth)acrylate, butoxyethyl (meth)acrylate, butyl (meth)acrylate, cetyl (meth)acrylate, ethyleneoxide-modified (hereinafter this may be referred to as "EO") cresol (meth)acrylate, dipropylene glycol (meth)acrylate, ethoxylated phenyl (meth)acrylate, ethyl (meth)acrylate, isoamyl (meth)acrylate, isobutyl (meth)acrylate, isooctyl (meth)acrylate, cyclohexyl (meth)acrylate, isobornyl (meth)acrylate, dicyclopentanyl (meth)acrylate, dicyclopentanyloxyethyl (meth)acrylate, isomyristyl (meth)acrylate, lauryl (meth)acrylate, methoxydiproylene glycol (meth)acrylate, methoxytripropylene glycol (meth)acrylate, methoxypolyethylene glycol (meth) acrylate, methoxytriethylene glycol (meth)acrylate, methyl (meth)acrylate, neopentyl glycol benzoate (meth)acrylate, nonylphenoxypolyethylene glycol (meth)acrylate, nonylphenoxypolypropylene glycol (meth)acrylate, octyl (meth)acrylate, paracumylphenoxyethylene glycol (meth)acrylate, epichlorohydrin (hereinafter referred to as "ECH")-modified phenoxyacrylate, phenoxyethyl (meth)acrylate, phenoxydiethylene glycol (meth) acrylate, phenoxyhexaethylene glycol (meth)acrylate, phenoxytetraethylene glycol (meth)acrylate, polyethylene glycol (meth)acrylate, polyethylene glycol-polypropylene glycol (meth)acrylate, polypropylene glycol (meth)acrylate, stearyl (meth)acrylate, EO-modified succinic acid (meth)acrylate, tert-butyl (meth)acrylate, tribromophenyl (meth)acrylate, EO-modified tribromophenyl (meth)acrylate, tridodecyl (meth)acrylate, p-isopropenylphenol, styrene, α-methylstyrene, acrylonitrile, N-vinylpyrrolidone.

Among the monofunctional polymerizable monomers having ethylenically unsaturated bonds, a monofunctional (meth)acrylate compound is preferably used in the invention from the viewpoint of photocurability. As the monofunctional (meth)acrylate compound, monofunctional (meth)acrylate compounds can be selected among those exemplified as the ethylenically unsaturated bond-having monofunctional polymerizable monomer.

Among the monofunctional (meth)acrylate compounds, preferred are monofunctional (meth)acrylate compounds having an aromatic structure and/or alicyclic hydrocarbon structure in view of dry etching resistance. Among the monofunctional (meth)acrylate compounds having an aromatic structure and/or alicyclic hydrocarbon structure, preferred are benzyl (meth)acrylate, 1- or 2-naphthyl(meta)acrylate, 1- or 2-naphthylmethyl (meth)acrylate, dicyclopentanyl (meth)acrylate, dicyclopentanyloxyethyl (meth)acrylate, isobornyl (meth)acrylate, adamantyl (meth)acrylate. More preferred are (meth) acrylates having a naphthalene structure, and particularly preferred are 1- or 2-naphthyl(meta)acrylate, 1- or 2-naphthylmethyl (meth)acrylate.

As the other polymerizable monomer, also preferred is a polyfunctional polymerizable unsaturated monomer having two or more ethylenic unsaturated bond-containing groups.

Preferred examples of the difunctional polymerizable unsaturated monomer having two ethylenic unsaturated bond-containing groups for use in the invention include diethylene glycol monoethyl ether (meth)acrylate, dimethylol-dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy-polyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalic acid diacrylate, hydroxypivalic acid neopentyl glycol di(meth)acrylate, neopentyl glycol di(meth)acrylate, EO-modified neopentyl glycol diacrylate, propyleneoxide (hereinafter referred to as "PO")-modified neopentyl glycol diacrylate, caprolactone-modified hydroxypivalate neopentyl glycol, stearic acid-modified pentaerythritol di(meth)acrylate, ECH-modified phthalic acid di(meth)acrylate, poly(ethylene glycol-tetramethylene glycol) di(meth)acrylate, poly(propylene glycol-tetramethylene glycol) di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethyloltricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerol di(meth)acrylate, dipropylene glycol di(meth)acrylate, divinylethylene-urea, divinylpropylene-urea.

Of those, especially preferred for use in the invention are difunctional (meth)acrylates such as neopentyl glycol di(meth)acrylate, 1,9-nonanediol di(meth)acrylate, tripropylene glycol di(meth)acrylate, tetraethylene glycol di(meth)acrylate, hydroxypivalate neopentyl glycol di(meth)acrylate, polyethylene glycol di(meth)acrylate, o-, m- or p-benzendi (meth)acrylate, and o-, m- or p-xylylenedi(meth)acrylate.

Examples of the polyfunctional polymerizable unsaturated monomer having at least three ethylenic unsaturated bond-having groups include ECH-modified glycerol tri(meth)acrylate, EO-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylater dipentaerythritol hydroxy-penta(meth)acrylate, alkyl-modified dipentaerythritol penta(meth)acrylater dipentaerythritol poly(meth)acrylate, alkyl-modified dipentaerythritol tri(meth)acrylate, ditrimethylolpropane tetra(meth)acrylate, pentaerythritol ethoxy-tetra(meth)acrylate, pentaerythritol tetra(meth)acrylater etc.

Of those, especially preferred for use in the invention are tri- or more functional (meth)acrylates such as EO-modified glycerol tri(meth)acrylate, PO-modified glycerol tri(meth)acrylate, trimethylolpropane tri(meth)acrylate, EO-modified trimethylolpropane tri(meth)acrylate, PO-modified trimethylolpropane tri(meth)acrylate, dipentaerythritol hexa(meth)acrylate, pentaerythritol ethoxy-tetra(meth)acrylate, and pentaerythritol tetra(meth)acrylate.

Among the polyfunctional polymerizable unsaturated monomers having two or more ethylenically unsaturated bonds, a polyfunctional (meth)acrylate is preferably used in the invention from the viewpoint of photocurability. Furthermore, the polyfunctional (meth)acrylate as mentioned herein is the generic term referring to the difunctional (meth)acrylates and the trifunctional or higher functional (meth)acrylates. As specific examples of the polyfunctional (meth)acrylate, various polyfunctional (meth)acrylates can be used which can be selected among those exemplified as the polyfunctional polymerizable unsaturated monomers having two ethylenically unsaturated bonds and those exemplified as the polyfunctional polymerizable unsaturated monomers having three or more ethylenically unsaturated bonds.

The oxirane ring-having compound (epoxy compound) includes, for example, polyglycidyl esters of polybasic acids, polyglycidyl ethers of polyalcohols, polyglycidyl ethers of polyoxyalkylene glycols, polyglycidyl ethers of aromatic polyols, hydrogenated polyglycidyl ethers of aromatic polyols, urethane-polyepoxy compounds, epoxidated polybutadienes, etc. One or more of these compounds may be used either singly or as combined.

Examples of the oxirane ring-having compound (epoxy compound) preferred for use in the invention include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ether; polyglycidyl ethers of polyether polyols produced by adding one or more alkylene oxides to aliphatic polyalcohol such as ethylene glycol, propylene glycol, glycerin or the like; diglycidyl esters of aliphatic long-chain dibasic acids; monoglycidyl ethers of aliphatic higher alcohols; monoglycidyl ethers of polyether alcohols produced by adding alkyleneoxide to phenol, cresol, butylphenol or the like; glycidyl esters of higher fatty acids, etc.

Of those, especially preferred are bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, polypropylene glycol diglycidyl ether.

Commercial products favorable for use herein as the glycidyl group-having compound are UVR-6216 (by Union Carbide), Glycidol, AOEX24, Cyclomer A200 (all by Daicel Chemical Industry), Epikote 828, Epikote 812, Epikote 1031, Epikote 872, Epikote CT508 (all by Yuka Shell), KRM-2400, KRM-2410, KRM-2408, KRM-2490, KRM-2720, KRM-2750 (all by Asahi Denka Kogyo), etc. One or more of these may be used either singly or as combined.

The production method for the oxirane ring-having compounds is not specifically defined. For example, the compounds may be produced with reference to publications of Lecture of Experimental Chemistry 20, 4th Ed., Organic Synthesis II, p. 213, ff. (Maruzen, 1992); The chemistry of heterocyclic compounds—Small Ring Heterocycles, Part 3, Oxiranes (edited by Alfred Hasfner, John & Wiley and Sons, An Interscience Publication, New York, 1985); Yoshimura, Adhesive, Vol. 29, No. 12, 32, 1985; Yoshimura, Adhesive, Vol. 30, No. 5, 42, 1986; Yoshimura, Adhesive, Vol. 30, No. 7, 42, 1986; JP-A-11-100378, Japanese Patents 2906245 and 2926262.

As the other polymerizable monomer for use in the invention, vinyl ether compounds may be in the curable composition.

Any known vinyl ether compounds are usable, including, for example, 2-ethylhexyl vinyl ether, butanediol 1,4-divinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A divinyloxyethyl ether, etc.

These vinyl ether compounds can be produced, for example, according to the method described in Stephen. C. Lapin, Polymers Paint Colour Journal, 179 (4237), 321 (1988), concretely through reaction of a polyalcohol or a polyphenol with acetylene, or through reaction of a polyalcohol or a polyphenol with a halogenoalkyl vinyl ether. One or more of these compounds may be used either singly or as combined.

As the other polymerizable monomer for use in the invention, styrene derivatives may also be employed. The styrene derivatives include, for example, styrene, p-methylstyrene, p-methoxystyrene, β-methylstyrene, p-methyl-β-methylstyrene, α-methylstyrene, p-methoxy-β-methylstyrene, p-hydroxystyrene, etc.

For the purpose of enhancing the releasability from mold and the coatability of the curable composition, a fluorine atom-having compound may be incorporated into the curable composition. The compound includes, for example, trifluoromethyl (meth)acrylate, pentafluoroethyl (meth)acrylate, (perfluorobutyl)ethyl (meth)acrylate, perfluorobutyl-hydroxypropyl (meth)acrylate, (perfluorohexyl)ethyl (meth)acrylate, octafluoropentyl (meth)acrylate, perfluorooctylethyl (meth)acrylate, tetrafluoropropyl (meth)acrylate, etc.

As the other polymerizable monomer for use in the invention, propenyl ethers and butenyl ethers may also be employed. Preferred examples of the propenyl ethers and butenyl ethers include, for example, 1-dodecyl-1-propenyl ether, 1-dodecyl-1-butenyl ether, 1-butenoxymethyl-2-norbornene, 1,4-di(1-butenoxy)butane, 1,10-di(1-butenoxy)decane, 1,4-di(1-butenoxymethyl)cyclohexane, diethylene glycol di(1-butenyl) ether, 1,2,3-tri(1-butenoxy)propane, propenyl ether propylene carbonate, etc.

Among these polymerizable monomers, the polymerizable monomer used in the curable composition of the invention is preferably a polymerizable unsaturated monomer having 1 to 6 ethylenically unsaturated bond-having groups from the viewpoint of improving the curability.

The polymerizable monomer used in the curable composition of the invention is preferably a mixture of the monofunctional (meth)acrylate compound and the polyfunctional (meth)acrylate compound, among the polymerizable unsaturated monomers having 1 to 6 ethylenically unsaturated bond-having groups from the viewpoint of the viscosity of the curable composition and the photocurability.

The mixing ratio of the monofunctional (meth)acrylate compound to the polyfunctional (meth)acrylate compound is preferably from 95/5 to 20/80, more preferably from 90/10 to 40/60, and particularly preferably from 80/20 to 60/40 in terms of ratio by weight. If the mixing ratio of the monofunctional (meth)acrylate compound to the polyfunctional (meth)acrylate compound is from 95/5 to 40/60 in terms of ratio by weight, the curability is sufficient, and the curable composition has a low-viscosity, thereby it being preferable.

In the polyfunctional (meth)acrylate compound, the ratio of the difunctional (meth)acrylate to the trifunctional or higher (meth)acrylate is preferably from 100/0 to 20/80, more preferably from 100/0 to 50/50, and even more preferably from 100/0 to 70/30 in terms of ratio by mass. Since the trifunctional or higher functional (meth)acrylate has a higher viscosity than the difunctional (meth)acrylate, a greater amount of the difunctional (meth)acrylate is favorable so the viscosity of the curable composition of the invention can be lowered.

The total content of the polymerizable monomers in the curable composition for imprints of the invention is preferably from 50 to 99.5% by mass, more preferably from 70 to 99% by mass, and particularly preferably from 90 to 99% by mass, relative to all the components except the solvent, from the viewpoint of improving the curability and improving the viscosity of the curable composition of the invention.

—Viscosity of Polymerizable Monomer—

The content of the polymerizable monomer having a viscosity at 25° C. of 7 mPa·s or more is 80% by mass or more, relative to all the polymerizable monomers contained in the curable composition of the invention.

The content of the polymerizable monomer having a viscosity at 25° C. of 7 to 200 mPa·s contained in the curable composition of the invention is preferably 80% by mass or more, relative to all the polymerizable monomers, the content of the polymerizable monomer having a viscosity at 25° C. of 7 to 150 mPa·s is more preferably 80% by mass or more, the content of the polymerizable monomer having a viscosity at 25° C. of 7 to 100 mPa·s is particularly preferably 80% by mass or more, and the content of the polymerizable monomer having a viscosity at 25° C. of 8 to 50 mPa·s is most preferably 80% by mass or more, relative to all the polymerizable monomers. For the polymerizable monomer contained in the curable composition of the invention, a polymerizable monomer which is liquid at 25° C. preferably constitutes 80% by mass or more of all the polymerizable monomers.

Specific viscosities at 25° C. of the polymerizable monomers that can be used in the invention are shown in Table 1 below. Furthermore, the polymerizable monomers that can be used in the invention are not limited to these specific examples.

TABLE 1

| Compound | Polymerizable monomer | Viscosity at 25° C. (mPa·s) |
|---|---|---|
| M1 | benzyl acrylate | 2.3 |
| M2 | N-vinylpyrrolidone | 2 |
| M3 | neopentyl glycol | 5.7 |
| M4 | nonanediol diacrylate | 8 |
| M5 | 1-naphthylmethyl acrylate | 24 |
| M6 | m-xylylene diacrylate | 10 |
| M7 | 4-cyanobenzyl acrylate | 9 |
| M8 | isoboronyl acrylate | 11 |
| M9 | trimethylolpropane triacrylate | 72 |
| M10 | tricyclodecane dimethanol diacrylate | 130 |
| M11 | pentaerythritol tetraacrylate | 1200 |
| M12 | ethoxybisphenol A diacrylate | 1200 |

The content of the polymerizable monomer having a viscosity at 25° C. of 7 to 200 mPa·s is more preferably 85% by mass or more, even more preferably 90% by mass or more, and most preferably 95% by mass or more.

Since the curable composition of the invention has a small content of the polymerizable monomer having a viscosity at 25° C. of less than 7 mPa·s, the viscosity of the composition can be lowered by lowering the content of the high-viscosity polymerizable monomer having a viscosity at 25° C. of 200 mPa·s or more.

The solution of a mixture of all the polymerizable monomers contained in the curable composition of the invention preferably has a viscosity at 25° C. from 5 to 50 mPa·s, more preferably from 6 to 40 mPa·s, even more preferably from 7 to 30 mPa·s, and most preferably from 8 to 25 mPa·s. By setting the viscosity of the polymerizable monomer from 5 to 50 mPa·s, the mold chargibility is further improved, and a rectangular pattern profile is easily obtained even at a low mold-pressing pressure in imprinting.

Preferred combinations of the contents of a polymerizable monomer having a viscosity at 25° C. of 7 to 200 mPa·s and the viscosities at 25° C. of the solution of a mixture of all the polymerizable monomers are as follows. In preferred embodiments, the content of a polymerizable monomer having a viscosity at 25° C. of 7 to 200 mPa·s is 80% by mass or more, relative to all the polymerizable monomers, and the viscosity at 25° C. of the solution of a mixture of all the polymerizable monomers is from 5 to 50 mPa·s. More preferably, the content of a polymerizable monomer having a viscosity at 25° C. of 7 to 150 mPa·s is 85% by mass or more, relative to all the polymerizable monomers, and the viscosity at 25° C. of the solution of a mixture of all the polymerizable monomers is from 6 to 40 mPa·s. Particularly preferably, the content of a polymerizable monomer having a viscosity at 25° C. of 7 to 100 mPa·s is 90% by mass or more, relative to all the polymerizable monomers, and the viscosity at 25° C. of the solution of a mixture of all the polymerizable monomers is from 7 to 30 mPa·s. Most preferably, the content of a polymerizable monomer having a viscosity at 25° C. of 8 to 50 mPa·s is 95% by mass or more, relative to all the polymerizable monomers, and the viscosity at 25° C. of the solution of a mixture of all the polymerizable monomers is from 8 to 25 mPa·s.

Photopolymerization Initiator (B)

The curable composition for imprints of the invention comprises a photopolymerization initiator. As the photopolymerization initiator in the invention, usable is any compound capable of generating an active radical for polymerization of the above-mentioned polymerizable monomer through photoirradiation. As the photopolymerization initiator, preferred are radical polymerization initiators. In the invention, two or more different types of photopolymerization initiators may be used, as combined.

The content of the photopolymerization initiator may be, for example, from 0.01 to 15% by mass of all the components constituting the curable composition except solvent, preferably from 0.1 to 12% by mass, more preferably from 0.2 to 7% by mass. In case where two or more different types of photopolymerization initiators are used, the total amount thereof falls within the above range.

When the content of the photopolymerization initiator is at least 0.01% by mass, then it is favorable since the sensitivity (rapid curability), the power of resolution, the line edge accuracy and the coating film strength of the curable composition tend to be better. On the other hand, when the content of the photopolymerization initiator is at most 15% by mass, it is also favorable since the light transmittance, the discoloration resistance and the handlability of the curable composition tend to be better. Heretofore, inkjet compositions and compositions for liquid-crystal display color filters containing dye and/or pigments have been variously investigated in point of the preferred amount of the photopolymerization initiator and/or the photoacid generator to be in the curable compositions; however, there is no report relating to the preferred amount of the photopolymerization initiator and/or the photoacid generator to be added to photocurable compositions for imprints. In this connection, in the systems containing dye and/or pigment, the dye and/or the pigment may act as a radical-trapping agent and may have some influence on the photopolymerization and the sensitivity of the compositions. Taking this into consideration, the amount of the photopolymerization initiator to be added to these applications is optimized. On the other hand, in the curable composition for imprints of the invention, dye and/or pigment are not indispensable ingredients, and the optimum range of the photopolymerization initiator in the composition may differ from that in the field of inkjet compositions and compositions for liquid-crystal display color filters.

As the radical photopolymerization initiator for use in the invention, preferred are acylphosphine oxide compounds and oxime ester compounds from the viewpoint of the curing sensitivity and the absorption characteristics of the composition. As the photopolymerization initiator, for example, commercial products may be used. Their examples are Irgacure® 2959 (1-[4-(2-hydroxyethoxy)phenyl]-2-hydroxy-2-methyl-1-propan-1-one), Irgacure® 184 (1-hydroxycyclohexyl phenyl ketone), Irgacure® 500 (1-hydroxycyclohexyl phenyl ketone, benzophenone), Irgacure® 651 (2,2-dimethoxy-1,2-diphenylethan-1-one), Irgacure® 369 (2-benzyl-2-dimethylamino-1-(4-morpholinophenyl)butanone-1), Irgacure® 907 (2-methyl-1[4-methylthiophenyl]-2-morpholinopropan-1-one), Irgacure® 819 (bis(2,4,6-trimethylbenzoyl)-phenylphosphine oxide), Irgacure® 1800 (bis(2,6-dimethoxybenzoyl)-2,4,4-trimethylpentylphosphine oxide, 1-hydroxycyclohexyl phenyl ketone), Irgacure® 1800 (bis(2,6-dimethoxybenzoyl)-2,4,4-trimethylpentylphosphine oxide, 2-hydroxy-2-methyl-1-phenyl-1-propan-1-one), Irgacure® OXE01 (1,2-octanedione, 1-[4-(phenylthio)phenyl]-2-(O-benzoyloxime)), Darocur® 1173 (2-hydroxy-2-methyl-1-phenyl-1-propan-1-one), Darocur® 1116, 1398, 1174 and 1020, CGI242 (ethanone, 1-[9-ethyl-6-(2-methylbenzoyl)-9H-carbazol-3-yl]-1-(O-acetyloxime)), which are all available from Ciba; Lucirin TPO (2,4,6-trimethylbenzoyl-diphenylphosphine oxide), Lucirin TPO-L (2,4,6-trimethylbenzoylphenylethoxyphosphine oxide) which are both available from BASF; Esacure 1001M (1-[4-benzoylphenylsulfanyl]phenyl)-2-methyl-2-(4-methylphenylsulfonyl)propan-1-one available from Nihon SiberHegner; Adeka Optomer® N-1414 (carbazole/phenone compound), Adeka Optomer® N-1717 (acridine compound), Adeka Optomer® N-1606 (triazine compound), all available from Asahi Denka; Sanwa Chemical's TFE-triazine (2-[2-(furan-2-yl)vinyl]-4,6-bis(trichloromethyl)-1,3,5-triazine), Sanwa Chemical's TME-triazine (2-[2-(5-methylfuran-2-yl) vinyl]-4,6-bis(trichloromethyl)-1,3,5-triazine), Sanwa Chemical's MP-triazine (2-(4-methoxyphenyl)-4,6-bis(trichloromethyl)-1,3,5-triazine); Midori Chemical's TAZ-113 (2-[2-(3,4-dimethoxyphenyl)ethenyl]-4,6-bis(trichloromethyl)-1,3,5-triazine), Midori Chemical's TAZ-108 (2-(3,4-dimethoxyphenyl)-4,6-bis(trichloromethyl)-1,3,5-triazine; as well as benzophenone, 4,4'-bisdiethylaminobenzophenone, methyl-2-benzophenone, 4-benzoyl-4'-methyldiphenyl sulfide, 4-phenylbenzophenone, ethyl Michler's ketone, 2-chlorothioxanthone, 2-methylthioxanthone, 2-isopropylthioxanthone, 4-isopropylthioxanthone, 2,4-diethylthioxanthone, 1-chloro-4-propoxythioxanthone, 2-methylthioxanthone, thioxanthone ammonium salt, benzoin, 4,4'-dimethoxybenzoin, benzoin methyl ether, benzoin ethyl ether, benzoin isopropyl ether, benzoin isobutyl ether, benzyl dimethyl ketal, 1,1,1-trichloroacetophenone, diethoxyacetophenone, dibenzosuberone, methyl o-benzoylbenzoate, 2-benzoylnaphthalene, 4-benzoylbiphenyl, 4-benzoyldiphenyl ether, 1,4-benzoylbenzene, benzil, 10-butyl-2-chloroacridone, [4-(methylphenylthio)phenyl] phenylmethane), 2-ethylanthraquinone, 2,2-bis(2-chlorophenyl)-4,5,4',5'-tetrakis(3,4,5-trimethoxy phenyl)-1,2'-biimidazole, 2,2-bis(o-chlorophenyl)-4,5,4',5'-tetraphenyl-1,2'-biimidazole, tris(4-dimethylaminophenyl) methane, ethyl 4-(dimethylamino)benzoate, 2-(dimethylamino)ethyl benzoate, butoxyethyl 4-(dimethylamino)benzoate, etc.

In the invention, "light" includes not only those having with a wavelength falling within a range of ultraviolet, near-ultraviolet, far-ultraviolet, visible, infrared, and electromagnetic waves but also radiations. The radiations include, for example, microwaves, electron beams, EUV, X-rays. In addition, laser rays such as 248 nm excimer laser, 193 nm excimer laser, 172 nm excimer laser are also usable herein. These lights may be monochromatic lights (single wavelength lights) having passed through optical filters, or may be lights of different wavelengths (composite lights). For photoexposure, multiple photoexposure may be employable, and for the purpose of enhancing the film strength and the etching resistance of the composition, entire surface photoexposure may be effected after pattern formation.

The photopolymerization initiator in the invention must be suitably selected depending on the wavelength of the light source used; and preferred are those not generating gas during mold compression and photoexposure. Gas generation, if any, may cause mold contamination, therefore giving problems in that the mold must be washed frequently and the photocurable composition may be deformed in the mold and the transferred pattern accuracy may be thereby worsened.

The curable composition for imprints of the invention is preferably a radical-polymerizable composition, in which the polymerizable monomer (A) is a radical-polymerizable monomer and the photopolymerization initiator (B) is a radical polymerization initiator that generates a radical through photoirradiation.

Other Ingredients

In addition to the above-mentioned polymerizable monomer (A) and the photopolymerization initiator (B), the curable composition for imprints of the invention may comprise any other ingredients such as surfactant, antioxidant, solvent, polymer and others for various purposes not detracting from the effect of the invention.

—Surfactant—

Preferably, the curable composition for imprints of the invention comprises a surfactant. The content of the surfactant that may be in the composition may be, for example, from 0.001 to 5% by mass of the composition, preferably from 0.002 to 4% by mass, more preferably from 0.005 to 3% by mass. In case where two or more different types of surfactants are in the composition, the total amount thereof falls within the above range. When the surfactant content in the composition falls from 0.001 to 5% by mass, it is favorable from the viewpoint of the coating uniformity, therefore hardly worsening the mold transferability owing to excessive surfactant.

As the surfactant, preferred are nonionic surfactants. Preferably, the composition comprises at least one of a fluorine-containing surfactant, a silicone-type surfactant and a fluorine-containing silicone-type surfactant. More preferably the composition comprises both of a fluorine-containing surfactant and a silicone-type surfactant, or comprises a fluorine-containing silicone-type surfactant, most preferably comprises a fluorine-containing silicone-type surfactant. The fluorine-containing surfactant and the silicone-type surfactant are preferably nonionic surfactants.

"Fluorine-containing silicone-type surfactant" as referred to herein means a surfactant satisfying both the requirement of a fluorine-containing surfactant and that of a silicone-type surfactant.

Using the surfactant of the type may solve the problem of coating failures such as striation and flaky pattern formation (drying unevenness of resist film) that may occur when the curable composition for imprints of the invention is applied onto substrates on which various films are formed, for example, onto silicon wafers in semiconductor production, or onto glass square substrates, chromium films, molybdenum films, molybdenum alloy films, tantalum films, tantalum alloy films, silicon nitride films, amorphous silicon films, tin oxide-doped indium oxide (ITO) films or tin oxide films in production of liquid-crystal devices. In addition, the surfactant is effective for enhancing the flowability of the curable composition of the invention in the cavity of a female mold, for enhancing the mold-resist releasability, for enhancing the resist adhesiveness to substrates, and for lowering the viscosity of the composition. In particular, when the above-mentioned surfactant is added to the curable composition for imprints of the invention, the coating uniformity of the composition can be greatly improved; and in coating with it using a spin coater or a slit scan coater, the composition ensures good coating aptitude irrespective of the size of the substrate to which it is applied.

Examples of the nonionic fluorine-containing surfactant usable in the invention include Fluorad FC-430, FC-431 (Sumitomo 3M's trade names); Surflon S-382 (Asahi Glass's trade name); Eftop EF-122A, 122B, 122C EF-121, EF-126, EF-127, MF-100 (Tochem Products' trade names); PF-636, PF-6320, PF-656, PF-6520 (Omnova Solution's trade names); Futagent FT250, FT251, DFX18 (Neos' trade names); Unidyne DS-401, DS-403, DS-451 (Daikin's trade names); Megafac 171, 172, 173, 178K, 178A, F780F (Dai-Nippon Ink's trade names).

Examples of the nonionic silicone-type surfactant include SI-10 series (Takemoto Yushi's trade name), Megafac Paintad 31 (Dai-Nippon Ink's trade name), KP-341 (Shin-Etsu Chemical's trade name).

Examples of the fluorine-containing silicone-type surfactant include X-70-090, X-70-091, X-70-092, X-70-093 (Shin-Etsu Chemical's trade names); Megafac R-08, XRB-4 (Dai-Nippon Ink's trade names).

—Antioxidant—

Preferably, the curable composition for imprints of the invention comprises a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by Ciba-Geigy); Antigene P, 3C, FR, Sumilizer S, Sumilizer GA80 (by Sumitomo Chemical); Adekastab AO70, AO80, AO503 (by Adeka), etc. These may be used either singly or as combined.

The curable composition for imprints of the invention preferably comprises at least one of a nonionic surfactant or an antioxidant.

In addition, the composition more preferably comprises at least one from a nonionic fluorine-containing surfactant, a nonionic silicone-type surfactant, a nonionic fluorine-containing silicone-type surfactant, and an antioxidant.

The curable composition for imprints of the invention particularly preferably comprises a nonionic surfactant and an antioxidant. Furthermore, the composition more particularly preferably comprises at least one surfactant selected from a nonionic fluorine-containing surfactant, a nonionic silicone-type surfactant, and a nonionic fluorine-containing silicone-type surfactant, and an antioxidant.

—Polymerization Inhibitor—

Furthermore, the curable composition for imprints of the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount.

—Solvent—

A solvent may be used for the curable composition for imprints of the invention, in accordance with various needs. The polymerizable monomers are not included in the "solvent" in the invention. The solvent in the invention does not have any polymerizable functional groups. In particular, when a pattern having a film thickness of at most 500 nm is formed, the composition of the invention preferably comprises a solvent. The solvent is preferably, from the viewpoint of coating uniformity, a solvent having a boiling point at normal pressure from 70 to 200° C., more preferably from 80 to 180° C., and particularly preferably from 100 to 160° C.

Regarding the type of the solvent that can be used in the curable composition of the invention, any solvent capable of dissolving the composition of the invention may be used without limit, but from the viewpoints of the solubility of the composition and the coating uniformity, a solvent having any one or more of an ester structure, a ketone structure, a hydroxyl group, or an ether structure is preferred. Furthermore, among these structures, more preferred, from the viewpoint of coating uniformity, is a solvent having an ether structure. Concretely, a preferable solvent, from the viewpoint of coating uniformity, is a single or mixed solvent selected from propylene glycol monomethyl ether acetate, cyclohexanone, 2-heptanone, gammabutyrolactone, propylene glycol monomethyl ether, and ethyl lactate, and most preferred is a solvent containing propylene glycol monomethyl ether acetate.

Moreover, these solvents may be used singly or in combinations of two or more kinds thereof.

The content of the solvent in the curable composition of the invention may be optimized depending on regulation of the viscosity of the components other than the solvent, improvement of the coatability of the composition, and the intended thickness of the film. From the viewpoint of improving the coatability, the content of the solvent is preferably from 0 to 95% by mass, and more preferably from 0 to 90% by mass relative to the total composition. On the other hand, when a pattern, having a film thickness of at most 500 nm, is formed, the content of the solvent is preferably from 10 to 99% by mass, more preferably from 50 to 98% by mass, and particularly preferably from 80 to 98% by mass.

—Polymer Ingredient—

The curable composition of the invention may comprise a polyfunctional oligomer having a larger molecular weight than that of the above-mentioned, other polyfunctional monomer within a range capable of attaining the object of the invention, for the purpose of further increasing the crosslinking density of the composition. Examples of the photoradical-polymerizable polyfunctional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints of the invention may comprise any other polymer ingredient for the purpose of enhancing the dry etching resistance, the imprint aptitude and the curability of the composition. The polymer ingredient is preferably a polymer having a polymerizable functional group in the side chain thereof. The weight-average molecular weight of the polymer ingredient is preferably from 2000 to 100000, more preferably from 5000 to 50000, from the viewpoint of the miscibility of the polymer with the polymerizable monomers constituting the composition. The amount of the polymer ingredient to be added may be preferably from 0 to 30% by mass of the composition except the solvent therein, more preferably from 0 to 20% by mass, even more preferably from 0 to 10% by mass, most preferably at most 2% by mass. When the content of the polymer ingredient having a molecular weight of at least 2000 in the curable composition of the invention is at most 30% by mass of the composition except the solvent therein, then the patternability of the composition is bettered. From the viewpoint of the patternability of the composition, the resin content therein is preferably as small as possible, and except for the surfactant and other minor additives, preferably, the composition does not contain any additional resin ingredient.

In addition to the above-mentioned ingredients, the curable composition for imprints of the invention may comprise, if desired, release agent, silane coupling agent, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

(Process for Preparing the Curable Composition for Imprints)

The curable composition for imprints of the invention can be produced by mixing the above-mentioned ingredients. After the ingredients are mixed, the resulting mixture may be filtered through a filter having a pore size of from 0.003 μm to 5.0 μm to give a solution. The ingredients may be mixed and dissolved to prepare the composition, generally at a temperature falling within a range of from 0° C. to 100° C. The filtration may be effected in plural stages, or may be repeated plural times. The solution once filtered may be again filtered. Not specifically defined, the material of the filter may be any one, for example, polyethylene resin, polypropylene resin, fluororesin, nylon resin, etc.

(Curable Composition for Imprints)

Further, in case where the curable composition for imprints of the invention comprises a solvent, the viscosity at 25° C. of the total composition of the invention is preferably from 1 to 10 mPa·s from the viewpoint of uniformly forming a thin film. More preferably, the viscosity at 25° C. is from 1 to 7 mPa·s, and more preferably from 1 to 5 mPa·s. When the curable composition for imprints contains no solvent, the viscosity at 25° C. of the whole composition is preferably 5 to 60 mPa·s, more preferably 6 to 50 mPa·s, still more preferably 7 to 40 mPa·s.

The curable composition for imprints of the invention may form a finer micropattern at low cost and with high accuracy by a photoimprint method. Accordingly, the curable composition of the invention can form micropatterns heretofore formed by conventional photolithography technology at low cost and with high accuracy. For example, when the curable composition of the invention is applied onto a substrate or a support, and the layer comprising the composition is exposed to light, cured, and optionally dried (baked), it thus can be employed as a permanent film of an overcoat layer; an insulating film, and the like for use in liquid-crystal displays (LCD); and the like, and as an etching resist for semiconductor integrated circuits, recording materials, flat panel displays, or the like. In particular, the patterns formed by using the curable composition for imprints of the invention are excellent in etching property, and can also be preferably used as an etching resist in dry etching using fluorocarbon, etc.

Particularly, the curable composition for imprints of the invention has a good dry etching resistance.

[Patterning Method]

Next, a method for forming a pattern (particularly, a micropattern) using the curable composition for imprints of the invention will be described. In the patterning method of the invention, a micropattern can be formed through a step of applying the curable composition for imprints of the invention onto a substrate to form a patterning layer, a step of pressing a mold against the surface of the patterning layer, a step of irradiating the patterning layer with light, whereby the curable composition of the invention is cured to form a micropattern.

Hereinafter, the patterning method using the curable composition for imprints of the invention (pattern transferring method) will be specifically described.
(Step of Providing the Curable Composition of the Invention on a Substrate to Form a Patterning Layer)

In the patterning method of the invention, the curable composition of the invention is first provided, preferably applied, more preferably coated onto the substrate to form a patterning layer.

The providing method for providing the curable composition for imprints of the invention onto a substrate may be a well known coating method of, for example, a dip coating method, an air knife coating method, a curtain coating method, a wire bar coating method, a gravure coating method, an extrusion coating method, a spin coating method; a slit scanning method; an inkjet method, etc. The thickness of the patterning method of the curable composition of the invention may vary depending on the use thereof, and may be from 0.05 to 30 µm or so. The curable composition of the invention may be applied in a mode of multilayer coating. Between the substrate and the patterning method of the curable composition of the invention, any other organic layer may be formed, such as a planarizing layer, etc. With that, the patterning layer is not kept in direct contact with the substrate, and therefore, the substrate may be prevented from being contaminated with dust or from being scratched. The pattern to be formed of the curable composition of the invention may have good adhesiveness to the organic layer, if any, formed on the substrate.

In the patterning method of the invention using the curable composition for imprints of the invention, when a coating method in which an area (specific area) per certain volume of the composition remarkably increases in coating is used among the above-described coating methods, the effect of the invention is more remarkably exhibited, thereby it being preferable. Examples of such a preferable coating method include a spin coating method, a slit scanning method, and an inkjet method. In the patterning method of the invention, a method for providing the curable composition for imprints on a substrate is more preferably a spin coating method or an inkjet method.
—Substrate—

The substrate (base or support) to which the curable composition for imprints of the invention is provided may be selected from various materials depending on its use, including but not limited to, for example, quartz, glass, an optical film, a ceramic material, a vapor deposition film, a magnetic film, a reflective film, a metal substrate of Ni, Cu, Cr, Fe, or the like, paper, SOG (Spin On Glass), a polymer substrate such as a polyester film, a polycarbonate film, a polyimide film, and the like, a TFT array substrate, a PDP electrode plate, glass or a transparent plastic substrate, an electroconductive substrate of ITO, metal, or the like, an insulating substrate, a semiconductor substrate such as silicon, silicon nitride, polysilicon, silicon oxide, amorphous silicon, and the like. Further, the shape of the substrate is not specifically defined and it may be a tabular shape or a roll shape. Also, as described below, the substrate may be light-transmissive or non-light-transmissive, depending on the combination thereof with a mold, and the like.

In the step of providing the curable composition for imprints on a substrate to form the patterning layer, the thickness of the curable composition for imprints provided on the substrate (which may be hereinafter referred to as a film thickness in coating) is preferably 1 µm or less from the viewpoint of reduction of the residual film. If the film thickness of the coating is 1 µm or less, the effect of the invention is remarkably exhibited, thereby it being preferable. The film thickness of the coating is more preferably from 1 to 300 nm, and particularly preferably from 1 to 100 nm.
(Step of Pressing a Mold against the Surface of the Patterning Layer)

The patterning method of the invention comprises a step of pressing a mold against the surface of the patterning layer to transfer the pattern onto the patterning layer. Accordingly, a finer pattern preliminarily formed on the surface of the pressed mold can be transferred onto the patterning layer.

In the patterning method of the invention, during the period from the step of providing the curable composition for imprints on a substrate to form a patterning layer thereon to the step of irradiating the patterning layer with light, at least one of a heating step or a pressure-reducing step is preferably included, and a heating step and a pressure-reducing step are more preferably included.
(Heating Step)

In the patterning method of the invention, during the period from the step of providing the curable composition for imprints on a substrate to form a patterning layer thereon to the step of irradiating the patterning layer with light, a heating step is preferably included. When the heating step is included, the effect of the invention is more remarkably exhibited. More desirably, during the period from the step of providing the curable composition for imprints on a substrate to form a patterning layer thereon to the step of pressing a mold against the surface of the patterning layer, a heating step is preferably included, and a step of heating the patterning layer comprising the solvent to remove the solvent is more preferably included. The heating temperature is preferably from 30° C. to 150° C., more preferably from 40° C. to 120° C., and even more preferably from 50° C. to 110° C. The heating time is preferably from 10 seconds to 5 minutes, more preferably from 20 seconds to 3 minutes, and even more preferably from 30 seconds to 2 minutes.
(Pressure-Reducing Step)

In the patterning method of the invention, during the period from the step of providing the curable composition for imprints on a substrate to form a patterning layer thereon to the step of irradiating the patterning layer with light, a pressure-reducing step is preferably included. By including the pressure-reducing step, interference with the polymerization due to oxygen can be inhibited, and thus, pattern defects due to bubbles can be inhibited. Further, when the pressure-reducing step is included, the effect of the invention is more remarkably exhibited. Desirably, the pressure-reducing step preferably occurs before pressing the mold and/or while pressing the mold, and a normal pressure or increased pressure state is more preferably made with an inert gas such as nitrogen, and the like during pressing the mold and/or after pressing the mold.

The patterning method of the invention is generally performed at a mold-pressing pressure of at most 10 atmospheres. By setting mold pressure to at most 10 atmospheres, the mold and the substrate are barely deformed and patterning accuracy tends to increase. Also, the pressure unit tends to be smaller in size since the pressure given to the mold is low, thereby it being preferable. The mold pressure is preferably selected from the region capable of securing the mold transfer uniformity, within a range within which the residual film of the curable composition for photoimprints in the area of mold pattern projections is reduced.

—Mold—

As molds that can be used in the invention, a mold having a transferable pattern formed thereon is used. The pattern on the mold may be formed, for example, through photolithography, electronic beam lithography, or the like according to a desired processing accuracy, but the mold patterning method is not specifically defined in the invention.

—Mold Materials—

The mold materials that can be used in the invention will be described.

The light-transmissive mold material used in the invention is not specifically defined, but it may be any one having the desired strength and durability. Concretely, examples thereof include glass, quartz, a light-transparent resin such as PMMA, a polycarbonate resin, and the like, a transparent metal deposition film, a flexible film of polydimethylsiloxane, or the like, a photocured film, a metal film, and the like.

The non-light-transmissive mold material used in the invention where a light-transmissive substrate is used is not also specifically defined, but it may be any one having the predetermined strength. Concretely, examples thereof include but are not limited to a ceramic material, a deposition film, a magnetic film, a reflective film, a metal substrate of Ni, Cu, Cr, Fe, or the like, as well as SiC, silicon, silicon nitride, polysilicon, silicon oxide, amorphous silicon, and the like. Also, the mold is not also specifically limited in the shape, and it may be any one of a tabular-shaped mold and a roll-shaped mold. The roll-shaped mold is applied especially in cases where the continuous productivity of the transfer is desired.

The mold used in the patterning method of the invention may be used after the mold is subjected to release treatment for the purpose of enhancing the releasability of the curable composition for photoimprints from the surface of the mold. As the mold, those surface-treated with a silicone-base, fluorine-containing, or other type silane coupling agent, for which, for example, commercial release agents such as Optool DSX manufactured by Daikin Industries, Ltd., Novec EGC-1720 manufactured by Sumitomo 3M Limited, and the like, can be suitably used.

(Step of Irradiating the Patterning Layer with Light)

The patterning method of the invention comprises a step of irradiating the patterning layer with light. Accordingly, in the photoimprint lithography using the curable composition of the invention, a light-transmissive material is selected for at least one of the mold material and/or the substrate.

In the photoimprint lithography applied to the invention, the curable composition for imprints of the invention is applied onto a substrate to form a patterning layer thereon, and a light-transmissive mold is pressed against the surface of the layer. This is then irradiated with light from the back of the mold, and the patterning layer is thereby cured. Further, the curable composition for photoimprints is applied onto a light-transmissive substrate, then a mold is pressed against it, and this is irradiated with light from the back of the substrate, whereby the curable composition for photoimprints can be cured.

The photoirradiation may be attained while the mold is kept in contact or after the mold is released, but in the invention, it is preferably attained while the mold is kept in intimate contact in the patterning method of the invention.

In the patterning method of the invention, the irradiation dose of photoirradiation in the step of irradiating the patterning layer with light may be sufficiently larger than the irradiation dose necessary for curing. The irradiation dose necessary for curing is suitably determined depending on the amount of consumption of the unsaturated bonds in the curable composition for photoimprints and on the tackiness of the cured film as previously determined.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as γ rays, X rays, α rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nm ArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 200 mW/cm$^2$. When the light intensity is at least 1 mW/cm$^2$, then the producibility may increase since the photoexposure time may be reduced; and when the light intensity is at most 200 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, the photoirradiation is usually attained at a substrate temperature of room temperature, but the photoirradiation may be attained under heat for enhancing the reactivity. In the previous stage of photoirradiation, if it is kept in vacuum, there are effects of preventing incorporation with bubbles, preventing the reduction in reactivity due to incorporation with oxygen, and for enhancing the adhesiveness of the curable composition for photoimprints with mold, and as a result, the photoirradiation may be attained in vacuum. Further, in the patterning method of the invention, the preferable vacuum degree in photoirradiation is in the range of 10$^{-1}$ Pa to ordinary pressure.

In the patterning method of the invention, if desired, a step may be included in which after the pattern layer is cured through photoirradiation, the cured pattern is further cured under heat given thereto. Heating for thermal curing of the curable composition of the invention after photoirradiation is preferably attained at 150 to 280° C., and more preferably at 200 to 250° C. Further, the heating time is preferably from 5 to 60 minutes, and more preferably from 15 to 45 minutes.

[Pattern]

The pattern thus formed according to the patterning method of the invention as described in the above can be used as a permanent film for use in liquid-crystal displays (LCD) and others, or as an etching resist. After its production, the permanent film may be bottled in a container such as a gallon bottle or a coated bottle, and may be transported or stored. In this case, the container may be purged with an inert gas such as nitrogen, argon or the like for preventing the composition therein from being degraded. The composition may be transported or stored at ordinary temperature, but for preventing the permanent film from being degraded, it is preferably transported or stored at a controlled temperature of from −20° C. to 0° C. Needless-to-say, the composition is shielded from light to such a level on which its reaction does not go on.

In the permanent films (resists for structural members) used in liquid-crystal displays (LCD), and the like, and in the resists for use for substrate processing for electronic materials, the resist is preferably prevented from being contaminated as much as possible with metallic or organic ionic impurities in order that the resist does not interfere with the performance of the products. Accordingly, it is desirable that the concentration of the metallic or organic ionic impurities in the curable composition for imprints of the invention is at most 1000 ppm, preferably at most 10 ppm, and more preferably at most 100 ppm.

The pattern of the invention formed by the patterning method of the invention is also useful as an etching resist. In cases where the pattern of the invention is used as an etching resist, a nano-order micropattern is first formed on a substrate such as a silicon wafer with a thin film of $SiO_2$ or the like formed thereon, according to the patterning method of the invention. Next, by etching it with an etching gas, such as hydrogen fluoride, or the like in case of wet etching or $CF_4$, or the like in case of dry etching, a desired pattern can be formed on the substrate.

When the pattern has a height from the substrate surface to the highest portion of the pattern part excluding the height of the substrate (which may be hereinafter referred to as a pattern height) is 1 μm or less, the effect of the invention is remarkably exhibited, thereby it being preferable. The height from the substrate surface to the highest portion of the pattern part is more preferably from 1 to 200 nm, and particularly preferably from 10 to 100 nm.

The substrate surface as mentioned herein refers to a lowest part of the substrate surface.

EXAMPLES

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

The measurement of the viscosity was conducted at 25±0.2° C. using a RE-80 L-type rotational viscometer manufactured by Toki Sangyo Co., Ltd.

The measurement of the viscosity was conducted, respectively, by setting the rotation speed in the measurement at 100 rpm in the case of 0.5 mPa·s or more and less than 5 mPa·s, at 50 rpm in the case of 5 mPa·s or more and less than 10 mPa·s, at 20 rpm in the case of 10 mPa·s or more and less than 30 mPa·s, at 10 rpm in the case of 30 mPa·s or more and less than 60 mPa·s, at 5 rpm in the case of 60 mPa·s or more and less than 120 mPa·s, and at 1 rpm or 0.5 rpm in the case of 120 mPa·s or more.

Synthesis Example 1

(Synthesis of Polymerizable Monomer M6)

39.6 g of acrylic acid was dissolved in 80 ml of distilled water, and a solution of 22 g of sodium hydroxide dissolved in 80 ml of distilled water was slowly added thereto. To this solution, 0.04 g of 4-methoxyphenol, 7.8 g of benzyl tributyl ammonium chloride and 43.8 g of m-xylylene dichloride were added, and the mixture was reacted at 80° C. for 10 hours. The reaction solution was extracted from ethyl acetate, and the organic phase was washed with an aqueous 1% sodium hydroxide solution, water and saturated saline water. The organic phase was dried with anhydrous sodium sulfate and concentrated to give a crude product. This was purified through column chromatography to give 48 g of a polymerizable monomer M6. The polymerizable monomer M6 was liquid at 25° C. and had a viscosity at 25° C. of 10 mPa·s.

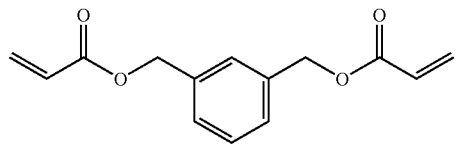 [SMILES: C=CC(=O)OCc1cccc(COC(=O)C=C)c1]

Among the polymerizable monomers M1 to M5 and M7 to M12 described in Table 1 above, M5 and M7 were synthesized in the same procedure as in Synthesis Example 1. Furthermore, the other polymerizable monomers were commercially purchased. The source of each commercially purchased polymerizable monomer was as follows.

M1: benzyl acrylate (Biscoat #160: manufactured by Osaka Organic Chemical Industry Ltd.)
M2: N-vinylpyrrolidone (manufactured by Aldrich)
M3: neopentyl glycol diacrylate (Kayarad NPGDA: manufactured by Nippon Kayaku Co., Ltd.)
M4: nonanediol diacrylate (Biscoat #260: manufactured by Osaka Organic Chemical Industry Ltd.)
M8: isobornyl acrylate (IBXA: manufactured by Osaka Organic Chemical Industry Ltd.)
M9: trimethylolpropane triacrylate (Aronix M-309: manufactured by Toa Gosei Co., Ltd.)
M10: tricyclodecane dimethanol diacrylate (NK ester A-DCP: manufactured by Shin-nakamura Chemical Corporation)
M11: pentaerythritol tetraacrylate (NK ester A-TMMT: manufactured by Shin-nakamura Chemical Corporation)
M12: ethoxylated bisphenol A diacrylate (NK ester A-BPE-4: manufactured by Shin-nakamura Chemical Corporation)

Example 1

(Preparation of Curable Composition for Imprints)

To the polymerizable monomers M7 (95% by mass) and M9 (5% by mass) shown in Table 1 above were added the polymerization initiator P-1 (2% by mass) as below, the surfactant W-1 (0.1% by mass) as below, the surfactant W-2 (0.04% by mass) as below, and the antioxidants A-1 and A-2 (1% by mass) as below to prepare a curable composition for imprints of Example 1. The Table 2 below shows the viscosity at 25° C. of the composition of Example 1 (containing the photopolymerization initiator and the surfactant but free from solvent) and the viscosity at 25° C. of a mixture of all the polymerizable monomers used in Example 1. Further, the types of the polymerizable monomers used and the viscosities at 25° C. of polymerizable monomers used are the same as shown in Table 1 above.

<Polymerization Initiator>
P1: 2,4,6-trimethylbenzoyl-ethoxyphenyl-phosphineoxide (Lucirin TPO-L: manufactured by BASF Corporation)
<Surfactants>
W-1: fluorine-containing surfactant (manufactured by Tochem Products).
W-2: silicone-type surfactant (Megafac Paintad 31: manufactured by Dai-Nippon Ink).
<Antioxidants>
A-1: Sumilizer GA80 (manufactured by Sumitomo Chemical).
A-2: Adekastab A0503 (manufactured by Adeka).

a imprinting device. The device was degassed in vacuum, and then nitrogen was introduced to the device by conducting the nitrogen purging for 10 minutes at normal pressure. The mold was pressed against the substrate under a pressure of 0.5 MPa at 25° C., and then this was exposed to light under a condition of 240 mJ/cm$^2$ from the back of the mold, and after the exposure, the mold was released to give a pattern. The obtained pattern profile was observed with a scanning electromicroscope.

(Patterning Condition 2)

Under the same condition as in Condition 1 except that a mold was put on the obtained coating film in vacuum (5 torr), followed by nitrogen purging, a pattern was obtained. The obtained pattern profile was observed with a scanning electromicroscope.

TABLE 2

| | Polymerizable monomer having a viscosity of less than 7 mPa·s (wt %) | Polymerizable monomer having a viscosity of 7 mPa·s or more (wt %) | | | Viscosity of Composition at 25° C. (mPa·s) | viscosity at 25° C. of mixture of all the polymerizable monomers (mPa·s) |
|---|---|---|---|---|---|---|
| Example 1 | | M7(95) | M9(5) | | 10 | 8.5 |
| Example 2 | | M7(65) | M9(35) | | 20 | 18 |
| Comparative Example 1 | M1(40) | M9(60) | | | 20 | 18 |
| Comparative Example 2 | M1(80) | M9(20) | | | 5 | 4.5 |
| Comparative Example 3 | M1(65) | M11(35) | | | 20 | 18 |
| Comparative Example 4 | M1(80) | M11(20) | | | 10 | 9 |
| Example 3 | M2(15) | M9(19) | M4(66) | | 10 | 9 |
| Comparative Example 5 | M2(35) M3(35) | M9(30) | | | 10 | 9 |
| Example 4 | | M6(86) | M11(14) | | 20 | 18 |
| Example 5 | M1(15) | M6(65) | M11(20) | | 20 | 18 |
| Comparative Example 6 | M1(25) | M6(52) | M11(23) | | 20 | 18 |
| Example 6 | | M5(80) | M6(20) | | 20 | 18 |
| Example 7 | | M5(60) | M6(20) | M7(20) | 15 | 13.5 |
| Example 8 | | M4(30) | M8(70) | | 10 | 9 |
| Example 9 | | M7(70) | M10(30) | | 20 | 18 |
| Example 10 | M1(10) | M6(40) | M7(40) | M12(10) | 14 | 12 |

Examples 2 to 10 and Comparative Examples 1 to 6

In the same manner as in Example 1 except that the polymerizable monomers used were changed into the combinations of the polymerizable monomers described in Table 2 above, each of the compositions of Examples and Comparative Examples was prepared.

(Patterning)

For the obtained compositions, the patterns were formed under the following conditions 1 to 4. The results are shown in Table 3 below.

(Patterning Condition 1)

Each of the compositions of Examples and Comparative Examples was applied onto a silicone substrate in a mode of spin coating to obtain a coating film having a film thickness of 2 micron. A mold of quartz having a rectangular line/space pattern (1/1) with a line width of 1 micron and a groove depth of 1 micron, of which the pattern surface had been processed with fluorine, was put on the obtained coating film and set in (Patterning Condition 3)

1 g of each of the compositions of Examples and Comparative Examples was dissolved in 9 g of propylene glycol monomethyl ether acetate. This was applied onto a silicone substrate using a mode of spin coating, and then heated on a hot plate at 65° C. for 1 minute to obtain a coating film having a film thickness of 150 nm. A mold of quartz having a rectangular line/space pattern (1/1) with a line width of 100 nm and a groove depth of 100 nm, of which the surface had been processed with fluorine, was put on the obtained coating film in vacuum (5 torr), followed by nitrogen purging. This was set in a imprinting device. This was pressed against the substrate under a pressure of 0.5 MPa at 25° C. under a nitrogen stream and was then exposed to light under a condition of 240 mJ/cm$^2$ from the back of the mold, and after the exposure, the mold was released to give a pattern. The obtained pattern profile was observed with a scanning electromicroscope.

(Patterning Condition 4)

Under the same condition as in Condition 3 except that the mold-pressing pressure was changed into 0.1 MPa, a pattern was obtained. The obtained pattern profile was observed with a scanning electromicroscope.

(Evaluation)

The patterns obtained by the patterning methods of Condition 1 to Condition 4 as described above were evaluated as follows.

A: A pattern in which the top of the pattern was rectangular and the height of the pattern is 80% or more of the groove depth of the mold was obtained.

B: A pattern in which the top of the pattern was roundish and the height of the pattern is 50% or more and less than 80% of the groove depth of the mold was obtained.

C: A pattern in which the top of the pattern was roundish and the height of the pattern is less than 50% of the groove depth of the mold was obtained.

TABLE 3

|  | Condition 1 | Condition 2 | Condition 3 | Condition 4 |
|---|---|---|---|---|
| Example 1 | A | A | A | A |
| Example 2 | A | A | A | A |
| Comparative Example 1 | A | B | C | C |
| Comparative Example 2 | A | B | C | C |
| Comparative Example 3 | A | B | C | C |
| Comparative Example 4 | A | B | C | C |
| Example 3 | A | A | B | B |
| Comparative Example 5 | A | B | C | C |
| Example 4 | A | A | A | A |
| Example 5 | A | A | B | B |
| Comparative Example 6 | A | B | C | C |
| Example 6 | A | A | A | A |
| Example 7 | A | A | A | A |
| Example 8 | A | A | A | A |
| Example 9 | A | A | A | A |
| Example 10 | A | A | B | B |

From Table 3 above, it could be confirmed that in Examples 1 to 10 in which the polymerizable monomer having a viscosity at 25° C. of 7 mPa·s or more constitutes 80% or more of all the polymerizable monomers, a good pattern was formed under any one of Conditions 1 to 4.

On the other hand, in Comparative Examples 1 to 6 in which the polymerizable monomer having a viscosity at 25° C. of 7 mPa·s or more constitutes less than 80% of all the polymerizable monomers, a good patternability was exhibited under Condition 1 in which the heating and pressure-reducing steps were not performed in patterning. However, it could be confirmed that in case of Condition 2 in which a vacuum step was performed in patterning, the top of the pattern was roundish in any of the Comparative Examples. Further, it could be confirmed that in the case of Condition 3 in which a heating step and a vacuum step were performed in patterning, the top of the pattern was roundish, and also the height of the pattern was lowered.

In addition, it could be confirmed that as compared with Example 5 and Example 10 in which the polymerizable monomer having a viscosity at 25° C. of 7 to 200 mPa·s was not used in an amount of 80% or more, in Examples 1, 2, 4, and 6 to 9 in which the polymerizable monomer having a viscosity at 25° C. of 7 to 200 mPa·s was used in an amount of 80% or more, better results were attained under Condition 3 in which a heating step and a vacuum step were performed in patterning.

Furthermore, it could be confirmed that when compared with Example 3 in which the polymerizable monomer having a viscosity at 25° C. of 7 to 200 mPa·s was used in an amount of 80% or more, but an ethylenic monofunctional unsaturated polymerizable monomer other than the monofunctional (meth)acrylate, that is, M2 (N-vinyl-2-pyrrolidone), was used, in Examples 1, 2, 4, and 6 to 9 in which a monofunctional (meth)acrylate and a polyfunctional (meth)acrylate, each having a viscosity of 7 to 200 mPa·s, were used, better results were attained under Condition 3 in which a heating step and a vacuum step were performed in patterning.

Evaluation was conducted under the same conditions as Condition 2 except that each of the compositions of Examples and Comparative Examples was applied onto a silicone substrate by an inkjet method instead of applying the composition onto a silicone substrate using a mode of spin coating.

As a result, the results were obtained having the same tendency as for Condition 2 in Table 3 above.

Example 101

(Residual Rate after Performing a Heating Step Subsequent to Application of the Polymerizable Monomer Alone)

To the polymerizable monomer M4, the polymerization initiator P-1 (2% by mass) as below, the surfactant W-1 (0.1% by mass) as below, the surfactant W-2 (0.04% by mass) as below, and the antioxidants A-1 and A-2 (1% by mass each) as below were added to prepare a curable composition for imprints of Example 101.

Examples 102 to 109 and Comparative Examples 101 to 103

In the same manner as in Example 101 except that the polymerizable monomer used was changed from M4 to the polymerizable monomer described in Table 4 below, each of the curable compositions for imprints of Examples and Comparative Examples was prepared.

(Evaluation of the Residual Rate of the Polymerizable Monomer After Performing a Heating Step Subsequent to Application)

Experimental Example 1

1 g of each of the compositions of Examples and Comparative Examples was dissolved in 9 g of propylene glycol monomethyl ether acetate. This was applied onto a silicone substrate using a mode of spin coating and then heated on a hot plate at 65° C. for 1 minute.

The obtained coating film was dissolved in acetonitrile, and this solution was analyzed using HPLC to quantitatively determine the content of each monomer. By comparing the content in the prepared composition with the content after performing a heating step subsequent to application, the residual rate of each polymerizable monomer remaining on the silicone substrate after performing a heating step subsequent to application was determined. A higher value indicates that the amount volatilized by performing a heating step subsequent to application is small and the compositional change of the composition before and after application and heating is small.

TABLE 4

| | Polymerizable monomer | | |
|---|---|---|---|
| | Compound | Viscosity at 25° C. (mPa·s) | Residual rate (%) |
| Comparative Example 101 | M1 | 2.3 | D |
| Comparative Example 102 | M2 | 2 | D |
| Comparative Example 103 | M3 | 5.7 | C |
| Example 101 | M4 | 8 | B |
| Example 102 | M5 | 24 | A |
| Example 103 | M6 | 10 | A |
| Example 104 | M7 | 9 | A |
| Example 105 | M8 | 11 | A |
| Example 106 | M9 | 72 | A |
| Example 107 | M10 | 130 | A |
| Example 108 | M11 | 1200 | A |
| Example 109 | M12 | 1200 | A |

The method for evaluating the residual rate is as follows.
A: 90% or more.
B: 80% or more and less than 90%.
C: 50% or more and less than 80%.
D: Less than 50%.

From Table 4 above, it could be confirmed that in Comparative Examples 101 to 103 in which M1 to M3 having a viscosity at 25° C. of less than 7 mPa·s were used, the polymerizable monomer was volatilized and the residual rate was lowered by application and heating. On the other hand, it could be confirmed that in Examples 101 to 109 of the invention in which M4 to M12 having a viscosity at 25° C. of 7 mPa·s or more were used, the residual rate was high and most of them remained on the substrate even by performing application and heating.

It was proved that by using the curable composition of the invention, the compositional change of the composition on the substrate in application and in heating can be reduced, and particularly a good pattern profile is obtained even when a pressure-reducing step or a heating step is performed.

The present disclosure relates to the subject matter contained in Japanese Patent Application No. 179986/2008 filed on Jul. 10, 2008 and Japanese Patent Application No. 151095/2009 filed on Jun. 30, 2009, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A curable composition for imprints, comprising at least one polymerizable monomer (A) and a photopolymerization initiator (B), wherein:
the at least one polymerizable monomer comprises a polymerizable monomer having a viscosity at 25° C. of from 8 to 50 mPa·s;
the at least one polymerizable monomer comprises a monofunctional (meth)acrylate compound having one (meth)acrylate group and a polyfunctional (meth)acrylate compound having two or more (meth)acrylate groups, with at least one of either said monofunctional (meth)acrylate compound or said polyfunctional (meth)acrylate compound being selected from the group consisting of nonanediol diacrylate, 4-cyanobenzyl acrylate, 1- or 2-naphthyl(meth)acrylate, 1- or 2-naphthylmethyl(meth)acrylate, o-, m- or p-benzenedi(meth)acrylate, and o-, m- or p-xylylenedi(meth)acrylate; and
the content of the polymerizable monomer is 95% by mass or more, relative to all polymerizable monomers contained in the composition.

2. The curable composition for imprints according to claim 1, wherein the monofunctional (meth)acrylate compound having one (meth)acrylate group is a monofunctional (meth)acrylate compound having an aromatic structure, an alicyclic hydrocarbon structure or both.

3. The curable composition for imprints according to claim 1, wherein the at least one polymerizable monomer comprises at least one of a monofunctional (meth)acrylate compound having an aromatic structure and one (meth)acrylate group or a polyfunctional (meth)acrylate compound having an aromatic structure and two or more (meth)acrylate groups.

4. The curable composition for imprints according to claim 1, wherein a mixture of all polymerizable monomers contained in the composition has a viscosity at 25° C. from 5 to 50 mPa·s.

5. The curable composition for imprints according to claim 1, wherein a mixture of all polymerizable monomers contained in the composition has a viscosity at 25° C. from 6 to 40 mPa·s.

6. The curable composition for imprints according to claim 1, wherein a mixture of all polymerizable monomers contained in the composition has a viscosity at 25° C. from 7 to 30 mPa·s.

7. The curable composition for imprints according to claim 1, which further comprises a solvent.

8. The curable composition for imprints according to claim 7, wherein the solvent comprises at least one solvent having one or more of an ester structure, a ketone structure, a hydroxyl group, or an ether structure.

9. The curable composition for imprints according to claim 1, which further comprises at least one of a nonionic surfactant or an antioxidant.

10. A curable composition for imprints, comprising at least one polymerizable monomer (A) and a photopolymerization initiator (B), wherein:
the at least one polymerizable monomer comprises a polymerizable monomer having a viscosity at 25° C. of 7 mPa·s or more;
the at least one polymerizable monomer comprises a monofunctional (meth)acrylate compound having one (meth)acrylate group and a polyfunctional (meth)acrylate compound having two or more (meth)acrylate groups, with at least one of either said monofunctional (meth)acrylate compound or said polyfunctional (meth)acrylate compound being selected from the group consisting of nonanediol diacrylate, 4-cyanobenzyl acrylate, 1- or 2-naphthyl(meth)acrylate, 1- or 2-naphthylmethyl(meth)acrylate, o-, m- or p-benzenedi(meth)acrylate, and o-, m- or p-xylylenedi(meth)acrylate; and
the content of the polymerizable monomer is 85% by mass or more, relative to all polymerizable monomers contained in the composition.

11. The curable composition for imprints according to claim 10, wherein the at least one polymerizable monomer comprises a polymerizable monomer having a viscosity at 25° C. of 7 to 200 mPa·s, and the content of the polymerizable monomer is 85% by mass or more, relative to all polymerizable monomers contained in the composition.

12. The curable composition for imprints according to claim 10, wherein the at least one polymerizable monomer comprises a polymerizable monomer having a viscosity at 25° C. of 7 to 150 mPa·s, and the content of the polymerizable monomer is 85% by mass or more, relative to all polymerizable monomers contained in the composition.

13. The curable composition for imprints according to claim 10, wherein the at least one polymerizable monomer comprises a polymerizable monomer having a viscosity at 25° C. of 7 to 100 mPa·s, and the content of the polymerizable monomer is 85% by mass or more, relative to all polymerizable monomers contained in the composition.

14. The curable composition for imprints according to claim 10, wherein the at least one polymerizable monomer comprises a polymerizable monomer having a viscosity at 25° C. of 8 to 50 mPa·s, and the content of the polymerizable monomer is 85% by mass or more, relative to all polymerizable monomers contained in the composition.

15. The curable composition for imprints according to claim 10, wherein the monofunctional (meth)acrylate compound having one (meth)acrylate group is a monofunctional (meth)acrylate compound having an aromatic structure, an alicyclic hydrocarbon structure or both.

16. The curable composition for imprints according to claim 10, wherein the at least one polymerizable monomer comprises at least one of a monofunctional (meth)acrylate compound having an aromatic structure and one (meth)acrylate group or a polyfunctional (meth)acrylate compound having an aromatic structure and two or more (meth)acrylate groups.

17. The curable composition for imprints according to claim 10, wherein a mixture of all polymerizable monomers contained in the composition has a viscosity at 25° C. from 5 to 50 mPa·s.

18. The curable composition for imprints according to claim 10, wherein a mixture of all polymerizable monomers contained in the composition has a viscosity at 25° C. from 6 to 40 mPa·s.

19. The curable composition for imprints according to claim 10, wherein a mixture of all polymerizable monomers contained in the composition has a viscosity at 25° C. from 7 to 30 mPa·s.

20. The curable composition for imprints according to claim 10, which further comprises a solvent.

21. The curable composition for imprints according to claim 10, wherein the solvent comprises at least one solvent having one or more of an ester structure, a ketone structure, a hydroxyl group, or an ether structure.

22. The curable composition for imprints according to claim 10, which further comprises at least one of a nonionic surfactant or an antioxidant.

* * * * *